US010782427B2

United States Patent
Kinpara et al.

(10) Patent No.: US 10,782,427 B2
(45) Date of Patent: Sep. 22, 2020

(54) RADIATION DETECTOR HAVING AN ALLOYED ELECTRODE

(71) Applicant: HAMAMATSU PHOTONICS K.K., Hamamatsu-shi, Shizuoka (JP)

(72) Inventors: Masanori Kinpara, Hamamatsu (JP); Toshiyuki Onodera, Sendai (JP); Keitaro Hitomi, Sendai (JP)

(73) Assignee: HAMAMATSU PHOTONIX K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/740,524

(22) PCT Filed: Jun. 19, 2017

(86) PCT No.: PCT/JP2017/022536
§ 371 (c)(1),
(2) Date: Dec. 28, 2017

(87) PCT Pub. No.: WO2018/012209
PCT Pub. Date: Jan. 18, 2018

(65) Prior Publication Data
US 2019/0346576 A1 Nov. 14, 2019

(30) Foreign Application Priority Data
Jul. 11, 2016 (JP) ................. 2016-136788

(51) Int. Cl.
*G01T 1/24* (2006.01)
*H01L 31/0224* (2006.01)
*H01L 31/08* (2006.01)

(52) U.S. Cl.
CPC ........ *G01T 1/24* (2013.01); *H01L 31/022408* (2013.01); *H01L 31/085* (2013.01)

(58) Field of Classification Search
CPC .. H01L 31/022408; H01L 31/085; G01T 1/24
(Continued)

(56) References Cited

U.S. PATENT DOCUMENTS 4,290,876 A * 9/1981 Nishiyama .......... C23C 14/3407
204/192.15
6,399,950 B1 * 6/2002 Kimura .................... G01T 1/24
250/370.09
(Continued)

FOREIGN PATENT DOCUMENTS

CN 101017803 A 8/2007
CN 103424765 12/2013
(Continued)

OTHER PUBLICATIONS

Hitomi, Keitaro et al., "Advances in TlBr detector development," Journal of Crystal Growth, vol. 379, 2013, pp. 93-98.
(Continued)

*Primary Examiner* — Blake C Riddick
(74) *Attorney, Agent, or Firm* — Faegre Drinker Biddle & Reath LLP (57) ABSTRACT

A radiation detector has a structure enabling suppression of polarization in a thallium bromide crystalline body and suppression of corrosion of an electrode in the air. The radiation detector comprises a first electrode, a second electrode, and a thallium bromide crystalline body provided between the first and second electrodes. At least one of the first electrode and the second electrode includes an alloy layer. The alloy layer is comprised of an alloy of metallic thallium and another metal different from the metallic thallium.

16 Claims, 9 Drawing Sheets

(58) Field of Classification Search
USPC .................. 250/370.09, 370.01, 370.12
See application file for complete search history.

(56) References Cited

U.S. PATENT DOCUMENTS

| | | | | |
|---|---|---|---|---|
| 6,407,393 | B1* | 6/2002 | Kim | H01L 27/14603 250/370.09 |
| 6,437,275 | B1* | 8/2002 | Kikuchi | H01H 11/048 218/118 |
| 6,462,344 | B1* | 10/2002 | Joo | H01L 27/1255 250/370.09 |
| 6,703,617 | B1* | 3/2004 | Spartiotis | H01L 27/14676 250/370.09 |
| 2001/0013577 | A1* | 8/2001 | Choo | H01L 27/14665 250/370.09 |
| 2002/0125819 | A1* | 9/2002 | Mishima | H01L 51/524 313/504 |
| 2004/0200972 | A1* | 10/2004 | Nam | G01T 1/2935 250/370.11 |
| 2006/0071579 | A1* | 4/2006 | Kando | H03H 9/0222 310/313 R |
| 2007/0023853 | A1* | 2/2007 | Partain | G01T 1/24 257/443 |
| 2007/0108393 | A1* | 5/2007 | Shoji | G01T 1/202 250/483.1 |
| 2007/0228421 | A1* | 10/2007 | Shioya | B82Y 10/00 257/213 |
| 2008/0157255 | A1* | 7/2008 | Kominami | H01L 27/1446 257/459 |
| 2011/0017912 | A1* | 1/2011 | Goto | C09K 11/628 250/361 R |
| 2011/0062467 | A1* | 3/2011 | Song | H01L 33/42 257/95 |
| 2011/0121185 | A1* | 5/2011 | Hirai | G01T 1/202 250/361 R |
| 2012/0001282 | A1* | 1/2012 | Goto | C09K 11/628 257/429 |
| 2013/0026364 | A1 | 1/2013 | Conway et al. | |
| 2014/0061486 | A1* | 3/2014 | Bao | G01J 3/0213 250/370.01 |
| 2017/0299734 | A1* | 10/2017 | Lee | G01N 23/227 |

FOREIGN PATENT DOCUMENTS

| | | |
|---|---|---|
| CN | 104081225 | 10/2014 |
| JP | 2005-223009 A | 8/2005 |
| JP | 2006-49773 A | 2/2006 |
| JP | 2006-80206 A | 3/2006 |
| JP | 2009-156800 A | 7/2009 |
| JP | 2010-93071 A | 4/2010 |
| JP | 5083964 B2 | 11/2012 |
| JP | 2013-238533 A | 11/2013 |
| JP | 2015-102340 A | 6/2015 |
| JP | 2017-62151 A | 3/2017 |
| TW | 201400091 A | 1/2014 |

OTHER PUBLICATIONS

Vasilij Kozlov, "TlBr raw material purification, crystal growth, annealing, detector fabrication and characterization for gamma-ray detector applications", Retrieve from the Internet: URL:https://core.ac.uk/download/pdf/14916638.pdf, Mar. 12, 2010, XP055516102.
Kim Hyun et al., "Electro-migration of impurities in TlBr", Journal of Applied Physics, American Institute of Physics, US, vol. 114, No. 13, Oct. 7, 2013, XP012175473.
A. Simanovskis et al., "Ageing effects in Me/TlBr-TlI systems", Thin Solid Films, Elsevier, Amsterdam, NL, vol. 232, No. 1, Sep. 10, 1993, p. 87-p. 93, XP025732501.
S. Stolyarova et al., "Ambient-induced interface reactions and adhesion failure in the Ag/TlBr-TlI system", Thin Solid Films, Elsevier, Amsterdam, NL, vol. 177, No. 1-2, Oct. 1989, p. 181-p. 188, XP025852078.
Hou Yao, "A New Two Dimensional Detector for X-Ray," ACTA Photonica Sinica vol. 30, No. 9, Sep. 30, 2001, p. 1138-1140 with English-language abstract included.
International Preliminary Report on Patentability (IPRP) dated Jan. 24, 2019 that issued in WO Patent Application No. PCT/JP2017/022536.

* cited by examiner

RADIATION DETECTOR HAVING AN ALLOYED ELECTRODE

TECHNICAL FIELD

The present invention relates to a radiation detector.

BACKGROUND ART

A radiation detector is a device which detects radiation such as X-rays and gamma rays applicable to a positron emission tomography (PET) device, a single photon emission computed tomography (SPECT) device, a gamma camera, a Compton camera, an imaging spectrometer and the like.

As the radiation detector, an example using a thallium halide crystal (for example, thallium bromide, thallium iodide, thallium chloride, and a mixed crystal thereof) is known. As an example, a detector having a parallel plate-shaped configuration in which a thallium bromide (TlBr) crystalline body is provided between a first electrode and a second electrode is known (refer to Patent Literatures 1 and 2). One of the first electrode and the second electrode is used as an anode electrode and the other is used as a cathode electrode. The radiation detector using the TlBr crystalline body is advantageous in that this may be manufactured easily at a low cost and has high sensitivity. Meanwhile, there also is a case where one or more electrodes are further provided between the first electrode and the second electrode in order to control an electric field or electrostatically shield the electric field.

Thallium electrodes comprised of only of thallium (Tl) as component metal are applied to the first electrode and the second electrode of the radiation detector disclosed in Patent Literatures 1 and 2. By using the thallium electrode, polarization of the TlBr crystalline body is suppressed, so that it was considered that long-term stable operation of the radiation detector was possible.

CITATION LIST

Patent Literature

Patent Literature 1: Japanese Patent No. 5083964
Patent Literature 2: Japanese Unexamined Patent Publication No. 2006-80206

SUMMARY OF INVENTION

Technical Problem

As a result of examination of the conventional radiation detectors, the inventors found the following problems. That is, if the thallium electrodes are used as the first electrode and the second electrode in the radiation detector to which the TlBr crystalline body is applied, the thallium electrode rapidly corrodes in the air, so that characteristics of the radiation detector deteriorate. This also occurs in a case where a metal layer of gold or the like, for example, is formed by vapor deposition on the thallium electrode. In order to suppress this deterioration (corrosion of the electrode), it is necessary to improve moisture resistance by sealing the thallium electrode with resin and the like after manufacturing the radiation detector, and to prevent oxidation and reaction with the air atmosphere.

However, in a case where the radiation detector is mounted on a readout circuit board as a two-dimensional detector, for example, electrical conduction between the electrode of the radiation detector and a pad of the readout circuit board is not obtained due to the sealing with the resin. This prevents practical application of the radiation detector to which the TlBr crystalline body is applied.

The present invention is made to solve the above-described problem, and an object thereof is to provide the radiation detector having a structure for effectively suppressing the deterioration in the detector characteristics due to the polarization of the TlBr crystalline body and effectively suppressing the corrosion of the electrode in the air.

Solution to Problem

A radiation detector according to the present embodiment comprises: first and second electrodes arranged so as to be opposed to each other; and a thallium bromide (TlBr) crystalline body arranged between the first and second electrodes as one aspect thereof. The thallium bromide crystalline body has a first electrode installation surface on which the first electrode is provided and a second electrode installation surface on which the second electrode is provided, and the first and second electrode installation surfaces are arranged so as to be opposed to each other. In such a configuration, at least the first electrode out of the first and second electrodes includes an alloy layer including first and second layer surfaces arranged so to be opposed to each other, and the second layer surface and the first electrode installation surface are arranged so as to interpose the first layer surface therebetween. In addition, the alloy layer is comprised of an alloy constituted by metallic thallium as a metallic element, and the alloy is constituted by the metallic thallium and one or more other metals different from the metallic thallium.

Meanwhile, the second electrode may have the same layer structure as that of the first electrode. In this case, the structure of the second electrode (for example, a layer structure) when the second electrode installation surface is seen from the second electrode side coincides with the structure of the first electrode (for example, a layer structure) when the first electrode installation surface is seen from the first electrode. However, this embodiment is also applicable to an aspect in which the layer structure of the first electrode and the layer structure of the second electrode are different from each other with respect to a type of the layer, the number of the layers and the like.

Advantageous Effects of Invention

The radiation detector according to this embodiment makes it possible to suppress deterioration in detector characteristics due to polarization of a TlBr crystal and also to suppress corrosion of an electrode in the air.

DESCRIPTION OF EMBODIMENTS

Description of Embodiment of Invention of Present Application

First, the contents of embodiments according to the present invention of the present invention are listed and described individually.

(1) As one aspect of the present embodiment, a radiation detector comprises: first and second electrodes arranged so as to be opposed to each other; and a thallium bromide (TlBr) crystalline body arranged between the first and second electrodes. The thallium bromide crystalline body includes a first electrode installation surface on which the first electrode is provided and a second electrode installation surface on which the second electrode is provided, and the first and second electrode installation surfaces are arranged so as to be opposed to each other. In such a configuration, at least the first electrode out of the first and second electrodes includes an alloy layer including first and second layer surfaces arranged so to be opposed to each other, and the second layer surface and the first electrode installation surface are arranged so as to interpose the first layer surface therebetween. In addition, the alloy layer is comprised of an alloy of metallic thallium and one or more other metals (metallic elements each forming an alloy together with metallic thallium) different from the metallic thallium.

Meanwhile, as another metallic element forming the alloy together with metallic thallium, each of other metals preferably includes any metal selected from a group of lead, silver, bismuth, and indium. Therefore, the alloy layer may be comprised of an alloy of two metals including metallic thallium, or may be comprised of an alloy of three or more metals including metallic thallium.

The second electrode may have the same structure as that of the first electrode. In this case, the structure of the second electrode (for example, a layered structure constituted by one or more metal layers) when the second electrode installation surface is seen from the second electrode side coincides with the structure of the first electrode when the first electrode installation surface is seen from the first electrode. That is, in a case where the second electrode has the same layer structure as that of the first electrode, the second electrode also includes the alloy layer including the first and second layer surfaces arranged so to be opposed to each other, and the second layer surface and the second electrode installation surface are arranged so as to interpose the first layer surface therebetween. Naturally, the alloy layer of the second electrode is also comprised of an alloy of metallic thallium and one or more other metals different from the metallic thallium. However, this embodiment is also applicable to an aspect in which the layer structure of the first electrode and the layer structure of the second electrode are different from each other with respect to a type of the layer, the number of the layers and the like.

(2) As one aspect of the present embodiment, the first electrode may include a low-resistance metal layer provided on the second layer surface of the alloy layer, the low-resistance metal layer comprised of metal having a resistance value lower than the resistance value of the alloy layer. Also, as one aspect of the present embodiment, the low-resistance metal layer is preferably comprised of gold. Meanwhile, in a case where the second electrode has the same layer structure as that of the first electrode, the second electrode includes the low-resistance metal layer comprised of, for example, gold provided on the second layer surface of the alloy layer. That is, the second electrode has a structure in which the alloy layer of the second electrode is arranged between the second electrode installation surface of the thallium bromide crystalline body and the low-resistance metal layer.

(3) As one aspect of the present embodiment, the first electrode may include a conductive intermediate layer provided between the second layer surface of the alloy layer and the low-resistance metal layer, the conductive intermediate layer serving to improve adhesion between the metal layer and the low-resistance metal layer. Also, as one aspect of the present embodiment, the intermediate layer is preferably comprised of any metal selected from a group of chromium, nickel, and titanium. Meanwhile, in a case where the second electrode has the same layer structure as that of the first electrode, the second electrode includes the conductive intermediate layer provided between the second layer surface of the alloy layer and the low-resistance metal layer serving to improve the adhesion between the alloy layer and the low-resistance metal layer. That is, the second electrode has a structure in which the conductive intermediate layer is arranged between the alloy layer of the second electrode and the low-resistance metal layer.

(4) As one aspect of the present embodiment, the first electrode may include a conductive under layer provided between the first electrode installation surface of the thallium bromide crystalline body and the first layer surface of the alloy layer, the conductive under layer serving to improve adhesion between the thallium bromide crystalline body and the alloy layer. Also, as one aspect of the present embodiment, the under layer is preferably comprised of any metal selected from the group of chromium, nickel, and titanium.

Meanwhile, in a case where the second electrode has the same layer structure as that of the first electrode, the second electrode includes the conductive under layer provided between the second electrode installation surface of the thallium bromide crystalline body and the first layer surface of the alloy layer serving to improve the adhesion between the thallium bromide crystalline body and the alloy layer. That is, the second electrode has a structure in which the conductive under layer is arranged between the thallium bromide crystalline body and the alloy layer of the second electrode.

As described above, each aspect listed in the column of the [Description of Embodiment of Invention of Present Application] may be applied to each of all the remaining aspects or all the combinations of the remaining aspects.

Detail of Embodiment of Invention of Present Application

A specific structure of a radiation detector according to the present embodiment is hereinafter described in detail with reference to the attached drawings. Meanwhile, the present invention is not limited to these illustrative examples, but it is intended that this is recited in claims, and equivalents thereof and all the modifications within the scope are included. Also, in the description of the drawings, the same reference sign is assigned to the same elements and the description thereof is not repeated.

FIGS. 1 to 6 illustrate cross-sectional structures of radiation detectors 1A to 1F according to first to sixth embodiments, respectively; in FIGS. 1 to 6, examples in which first electrodes 10A to 10F and second electrodes 20A to 20F have the same structures are illustrated. However, the structure of the first electrode and the structure of the second electrode do not necessarily have to coincide with each other regarding the type of the layer, the number of the layers and the like. That is, the structure of the embodiment illustrated in any one of FIGS. 1 to 6 may be adopted to the first electrode irrespective of the structure of the second electrode. In contrast, the structure of the embodiment illustrated in any one of FIGS. 1 to 6 may be adopted to the second electrode irrespective of the structure of the first electrode. Furthermore, a structure other than the structure of the aspect illustrated in any one of FIGS. 1 to 6 may be adopted to the structure of the second electrode.

First Embodiment

Figure 1:
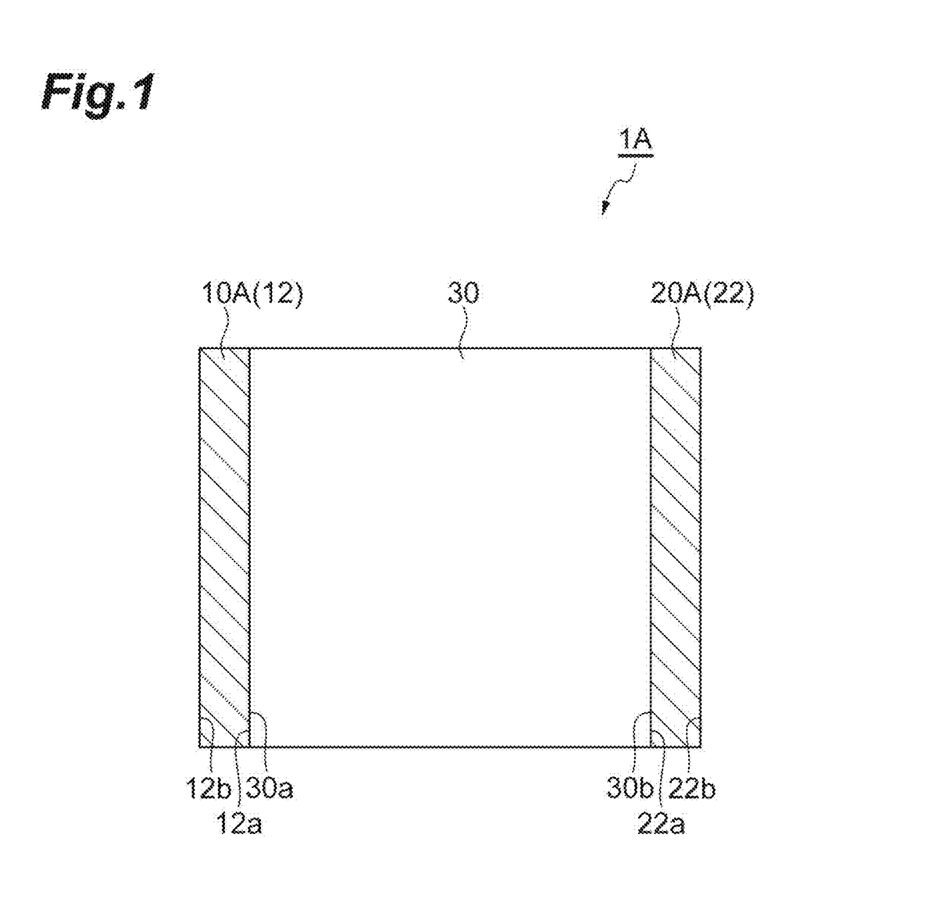
FIG. 1 is a view illustrating a cross-sectional structure of a radiation detector 1A according to a first embodiment.

FIG. 1 is a view illustrating a cross-sectional structure of the radiation detector 1A according to the first embodiment. The radiation detector 1A is a flat plate-shaped detector comprising: the first electrode 10A; the second electrode 20A; and a thallium bromide (TlBr) crystalline body 30 provided between the first electrode 10A and the second electrode 20A. The first electrode 10A is formed on a first electrode installation surface 30a out of two parallel surfaces of the TlBr crystalline body 30 by vapor deposition, for example, and the second electrode 20A is formed on a second electrode installation surface 30b opposed to the first electrode installation surface 30a by vapor deposition, for example. Meanwhile, in the example in FIG. 1, the first electrode 10A and the second electrode 20A have the same layer structure (in the example in FIG. 1, the layer structures bilaterally symmetrical with respect to the TlBr crystalline body 30).

The first electrode 10A includes an alloy layer 12 including a first layer surface 12a facing the first electrode installation surface 30a and a second layer surface 12b located on a side opposite to the first electrode installation surface 30a across the first layer surface 12a. In contrast, the second electrode 20A includes an alloy layer 22 including a first layer surface 22a facing the second electrode installation surface 30b and a second layer surface 22b located on a side opposite to the second electrode installation surface 30b across the first layer surface 22a. Thicknesses of the alloy layers 12 and 22 (lengths of layer areas along normal directions of the first and second electrode installation surfaces 30a and 30b) are, for example, tens of nm to hundreds of nm. Each of the alloy layers 12 and 22 is comprised of an alloy of metallic thallium (hereinafter simply referred to as "Tl") and one or more other metals (metallic elements forming an alloy together with Tl) different from the Tl. Each of the other metal elements forming the alloy together with Tl may be arbitrary, but is preferably any metal selected from a group of lead (Pb), silver (Ag), bismuth (Bi), and indium (In).

Each of the alloy layers 12 and 22 is comprised of an alloy such as Tl—Pb, Tl—Ag, Tl—Bi, Tl—In, Tl—Pb—Bi, and Tl—Pb—In, for example. That is, each of the alloy layers 12 and 22 is a layer containing the element Tl as metal, and is not a layer containing the element Tl only as a compound (for example, Tl oxide, Tl fluoride, Tl nitrate and the like). A content ratio of Tl in each of the alloy layers 12 and 22 is at a level at which Tl is detected by analysis using fluorescent X-ray (XRF) spectroscopy. Meanwhile, although there is a case where a surface of each of the alloy layers 12 and 22 (corresponding to the second layer surface 12b of the alloy layer 12 and the second layer surface 22b of the alloy layer 22) is oxidized by contact with air, the inside of the alloy layers 12 and 22 is not oxidized.

One of the first electrode 10A and the second electrode 20A is used as an anode electrode and the other is used as a cathode electrode. Since a halogenated thallium crystal shows ion conductivity, when voltage is applied to the TlBr crystalline body 30, $Tl^+$ ions accumulate under the cathode electrode and $Br^-$ ions accumulate under the anode electrode. The radiation detector 1A may detect radiation incidence by movement of an electron-hole pair generated by the incident radiation by the applied voltage, that is, by current flowing between both the electrodes.

The $Br^-$ ions accumulated under the anode electrode combine with Tl contained in the anode electrode (generation of TlBr). At the time of this combination, electrons are emitted. The $Tl^+$ ions accumulated under the cathode electrode combine with the above-described emitted electrons (generation of Tl). Tl and TlBr generated by the reaction described above are not ions and they have no charge. Therefore, polarization of the TlBr crystalline body 30 may be suppressed.

Since each of the first electrode 10A and the second electrode 20A is not the electrode comprised of only of Tl but the electrode comprised of an alloy of Tl and one or more other metals different from the Tl, corrosion in the air is suppressed. As a result, the radiation detector 1A need not be sealed with resin or the like. In other words, it is possible to mount the radiation detector 1A on a readout circuit board.

Each of the first electrode 10A and the second electrode 20A comprised of the alloy of Tl and one or more other metals has stronger adhesion to the TlBr crystalline body 30 as compared with the electrode comprised of only of Tl, so that possibility that the electrode is peeled from the TlBr crystalline body 30 at high temperature is suppressed. For example, reliability of the radiation detector 1A may be secured even if the radiation detector 1A is heated to high temperature when the radiation detector 1A is mounted on the readout circuit board.

Also, while the radiation detector including the electrode comprised of only of Tl has a stabilized characteristic, it is necessary to perform aging (operation of alternately applying voltage between the electrodes while changing the polarity thereof). In contrast, the radiation detector according to this embodiment including the electrode comprised of the alloy of Tl and one or more other metals different from the Tl need not perform such aging, and this has excellent energy resolution from the first.

Second Embodiment

Figure 2:
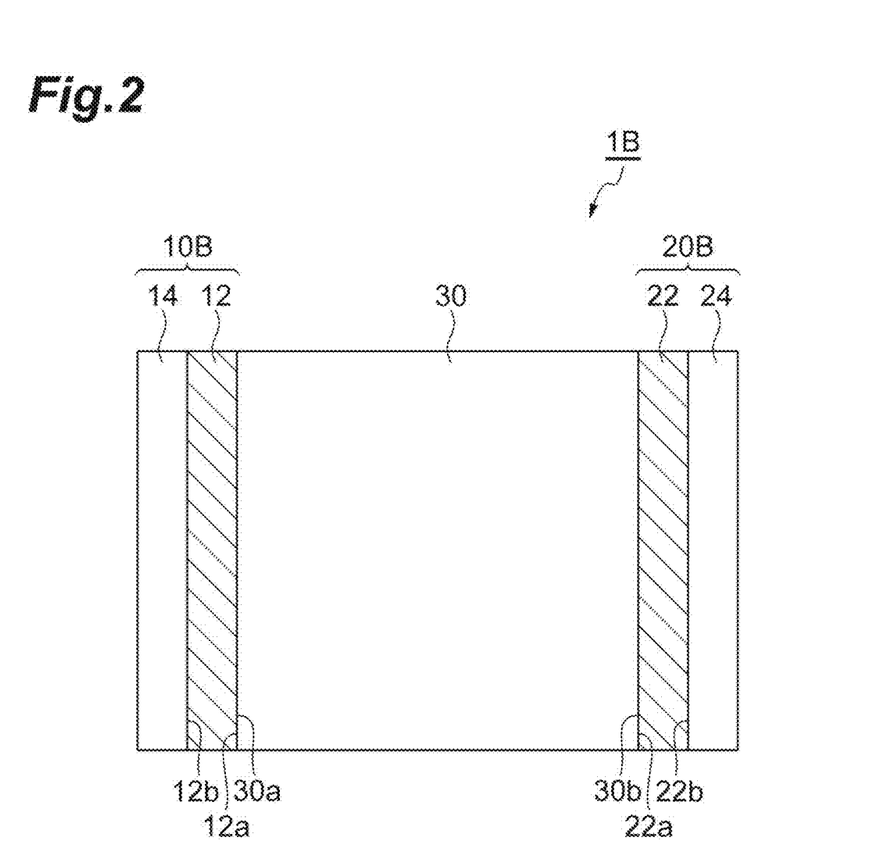
FIG. 2 is a view illustrating a cross-sectional structure of a radiation detector 1B according to a second embodiment.

FIG. 2 is a view illustrating a cross-sectional structure of a radiation detector 1B according to a second embodiment. The radiation detector 1B comprises: a first electrode 10B; a second electrode 20B; and a thallium bromide (TlBr) crystalline body 30 provided between the first electrode 10B and the second electrode 20B. A configuration of the second embodiment illustrated in FIG. 2 is the same as the configuration of the first embodiment illustrated in FIG. 1 except for an electrode structure. That is, although the first electrode 10B also includes an alloy layer 12 including a first layer surface 12a and a second layer surface 12b opposed to each other, this is different from the first electrode 10A in FIG. 1 in that a low-resistance metal layer 14 is formed on the second layer surface 12b of the alloy layer 12 by vapor deposition, for example. Also, although the second electrode 20B also includes an alloy layer 22 including a first layer surface 22a and a second layer surface 22b opposed to each other, this is different from the second electrode 22A in FIG. 1 in that a low-resistance metal layer 24 is formed on the second layer surface 22b of the alloy layer 22 by vapor deposition, for example. Meanwhile, in an example in FIG. 2, the first electrode 10B and the second electrode 20B have the same layer structure (in FIG. 2, the layer structures bilaterally symmetrical with respect to the TlBr crystalline body 30).

The low-resistance metal layer 14 is comprised of metal having a resistance value lower than the resistance value of the alloy layer 12. Similarly, the low-resistance metal layer 24 is also comprised of metal having a resistance value lower than the resistance value of the alloy layer 22. Each of the low-resistance metal layers 14 and 24 may be a single layer or a plurality of layers. A thickness of each of the low-resistance metal layers 14 and 24 is, for example, tens of nm to hundreds of nm. Any material making each of the low-resistance metal layers 14 and 24 may be used, but gold (Au) is preferably used. By providing the low-resistance metal layer comprised of low-resistance metal on the surface of the alloy layer, oxidation of the surface of the alloy layer is suppressed, and resistance between a pad on a readout circuit board and the electrode may be reduced for example.

Third Embodiment

Figure 3:
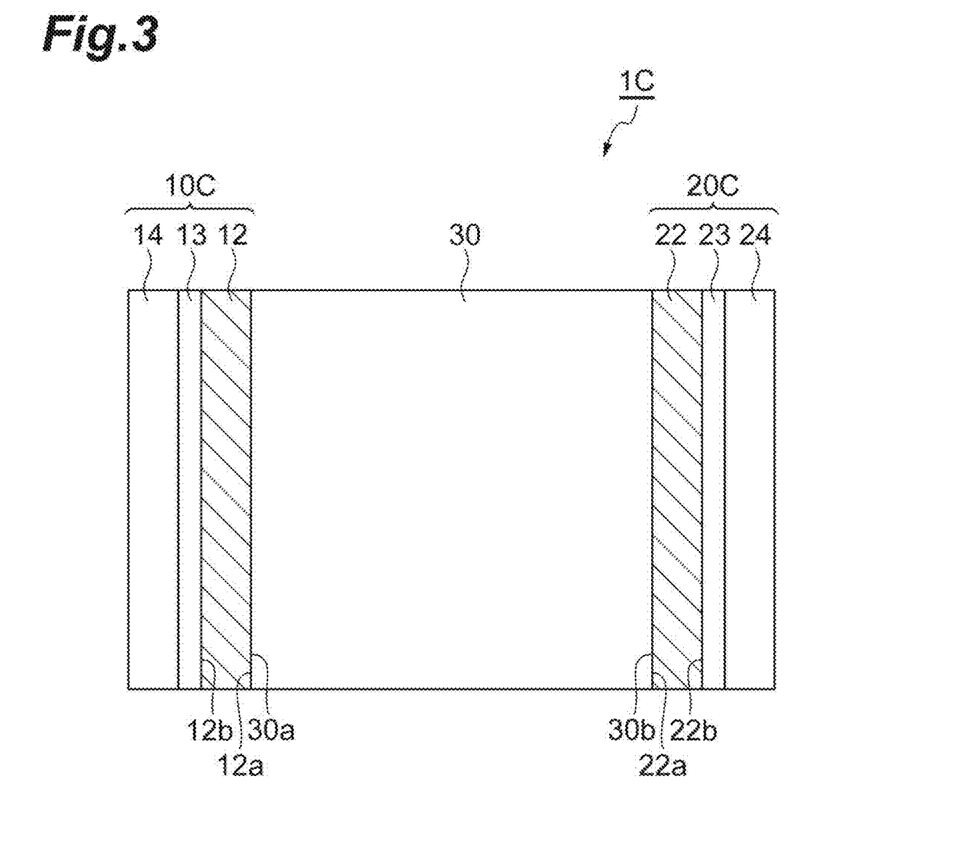
FIG. 3 is a view illustrating a cross-sectional structure of a radiation detector 1C according to a third embodiment.

FIG. 3 is a view illustrating a cross-sectional structure of a radiation detector 1C according to a third embodiment. The radiation detector 1C comprises: a first electrode 10C; a second electrode 20C; and a thallium bromide (TlBr) crystalline body 30 provided between the first electrode 10C and the second electrode 20C. A configuration of the third embodiment illustrated in FIG. 3 is the same as the configuration of the second embodiment illustrated in FIG. 2 except for an electrode structure. That is, although the first electrode 10C also includes an alloy layer 12 including a first layer surface 12a and a second layer surface 12b opposed to each other, and a low-resistance metal layer 14, this is different from the first electrode 10B in FIG. 2 in that an intermediate layer 13 is formed between the second layer surface 12b of the alloy layer 12 and the low-resistance metal layer 14 by vapor deposition, for example. Also, although the second electrode 20C also includes an alloy layer 22 including a first layer surface 22a and a second layer surface 22b opposed to each other, and a low-resistance metal layer 24, this is different from the second electrode 20B in FIG. 2 in that an intermediate layer 23 is formed between the second layer surface 22b of the alloy layer 22 and the low-resistance metal layer 24 by vapor deposition, for example. Meanwhile, in an example in FIG. 3, the first electrode 10B and the second electrode 20B have the same layer structure (the layer structures bilaterally symmetrical with respect to the TlBr crystalline body 30 in FIG. 3).

The intermediate layer 13 is inserted so as to improve adhesion between the alloy layer 12 and the low-resistance metal layer 14. The intermediate layer 23 is inserted so as to improve adhesion between the alloy layer 22 and the low-resistance metal layer 24. Each of the intermediate layers 13 and 23 has conductivity. A thickness of each of the intermediate layers 13 and 23 is, for example, several nm to hundreds of nm. Any material may be used for making each of the intermediate layers 13 and 23, but any metal selected from a group of chromium (Cr), nickel (Ni), and titanium (Ti) is preferably used.

Fourth Embodiment

Figure 4:
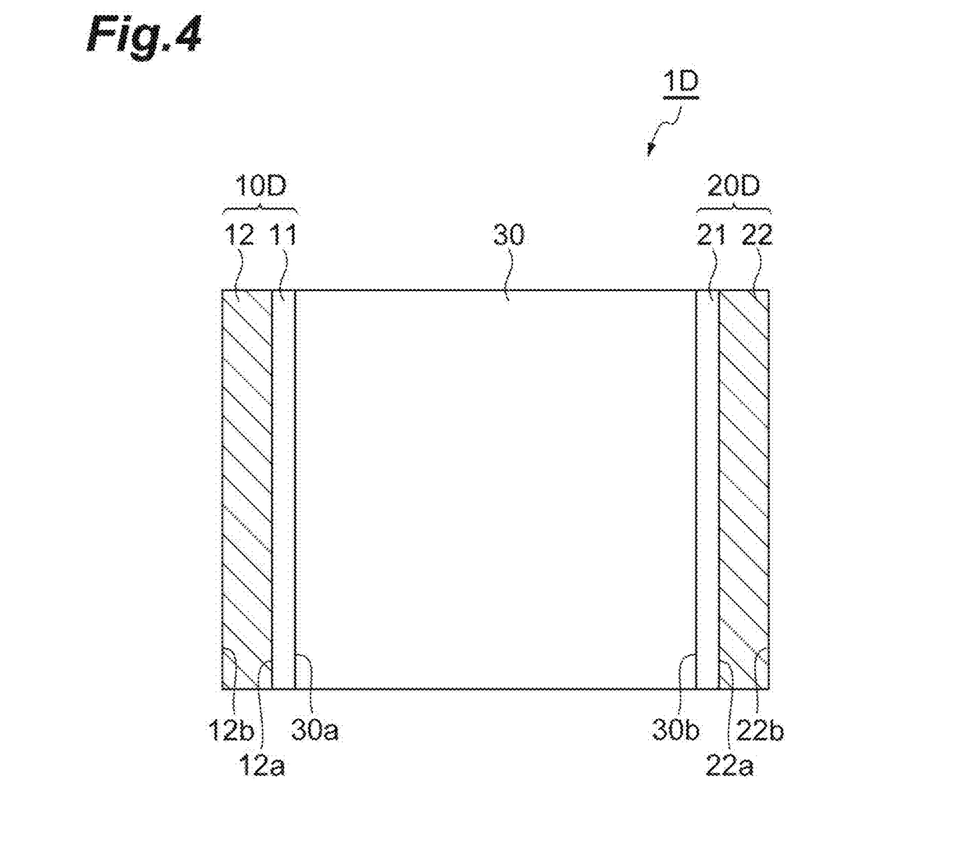
FIG. 4 is a view illustrating a cross-sectional structure of a radiation detector 1D according to a fourth embodiment.

FIG. 4 is a view illustrating a cross-sectional structure of a radiation detector 1D according to a fourth embodiment. The radiation detector 1D comprises: a first electrode 10D; a second electrode 20D; and a thallium bromide (TlBr) crystalline body 30 provided between the first electrode 10D and the second electrode 20D. A configuration of the fourth embodiment illustrated in FIG. 4 is the same as the configuration of the first embodiment illustrated in FIG. 1 except for an electrode structure. That is, although the first electrode 10D also includes an alloy layer 12 including a first layer surface 12a and a second layer surface 12b opposed to each other, this is different from the first electrode 10A in FIG. 1 in that an under layer 11 being a thin film having an island-shaped structure is formed between a first electrode installation surface 30a of the TlBr crystalline body 30 and the first layer surface 12a of the alloy layer 12 by vapor deposition (resistance heating method), for example. Meanwhile, with this configuration, the first electrode 10D is formed in a gap of the island-shaped structure. Also, although the second electrode 20D also includes an alloy layer 22 including a first layer surface 22a and a second layer surface 22b opposed to each other, this is different from the second electrode 20A in FIG. 1 in that an under layer 21 being a thin film having an island-shaped structure is formed between a second electrode installation surface 30b of the TlBr crystalline body 30 and the first layer surface 22a of the alloy layer 22 by vapor deposition (resistance heating method), for example. Meanwhile, the second electrode 20D is formed in a gap of the island-shaped structure. Also, in an example in FIG. 4, the first electrode 10D and the second electrode 20D have the same layer structure (the layer structures bilaterally symmetrical with respect to the TlBr crystalline body 30 in FIG. 4).

Fifth Embodiment

Figure 5:
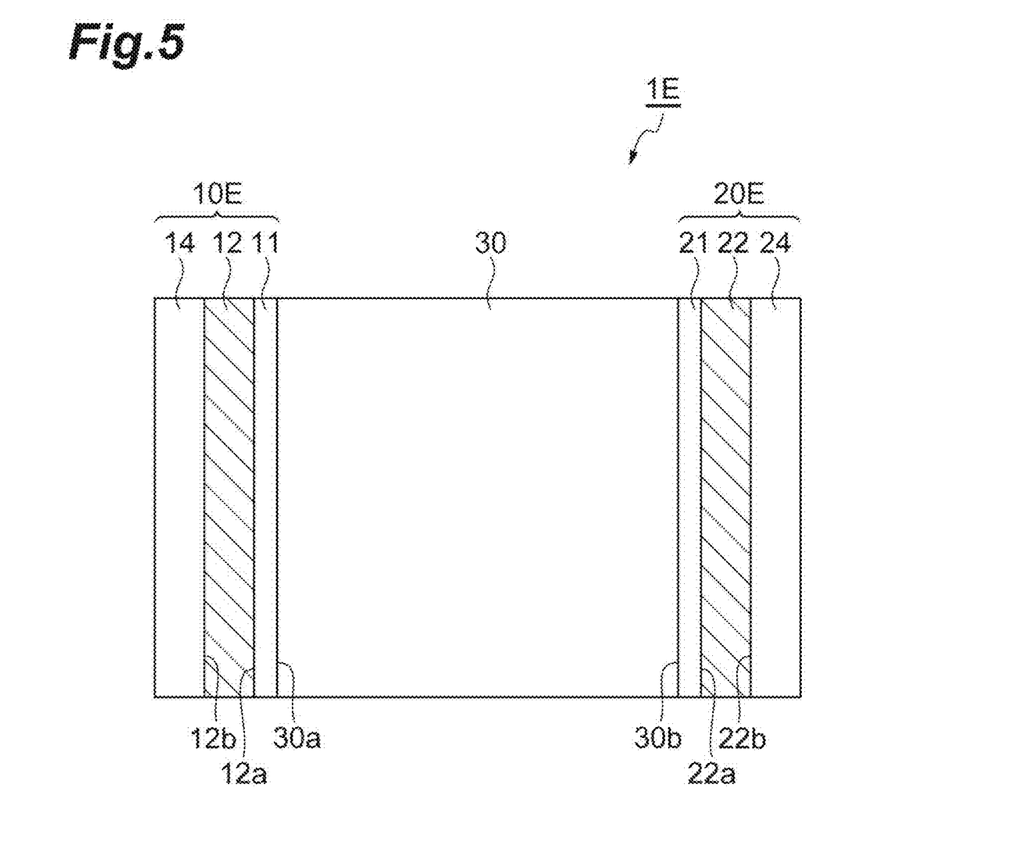
FIG. 5 is a view illustrating a cross-sectional structure of a radiation detector 1E according to a fifth embodiment.

FIG. 5 is a view illustrating a cross-sectional structure of a radiation detector 1E according to a fifth embodiment. The radiation detector 1E comprises: a first electrode 10E; a second electrode 20E; and a thallium bromide (TlBr) crystalline body 30 provided between the first electrode 10E and the second electrode 20E. A configuration of the fifth embodiment illustrated in FIG. 5 is the same as the configuration of the second embodiment illustrated in FIG. 2 except for an electrode structure. That is, although the first electrode 10E also includes an alloy layer 12 including a first layer surface 12a and a second layer surface 12b opposed to each other and a low-resistance metal layer 14, this is different from the first electrode 10B in FIG. 2 in that an under layer 11 being a thin film having an island-shaped structure is formed between a first electrode installation surface 30a of the TlBr crystalline body 30 and the first layer surface 12a of the alloy layer 12 by vapor deposition (resistance heating method), for example. Meanwhile, the first electrode 10D is formed in a gap of the island-shaped structure. Also, although the second electrode 20E also includes an alloy layer 22 including a first layer surface 22a and a second layer surface 22b opposed to each other, this is different from the second electrode 20B in FIG. 2 in that an under layer 21 being a thin film having an island-shaped structure is formed between a second electrode installation surface 30b of the TlBr crystalline body 30 and the first layer surface 22a of the alloy layer 22 by vapor deposition (resistance heating method), for example. Meanwhile, the second electrode 20E is formed in a gap of the island-shaped structure. Also, in an example in FIG. 5, the first electrode 10E and the second electrode 20E have the same layer structure (the layer structures bilaterally symmetrical with respect to the TlBr crystalline body 30 in FIG. 5).

Sixth Embodiment

Figure 6:
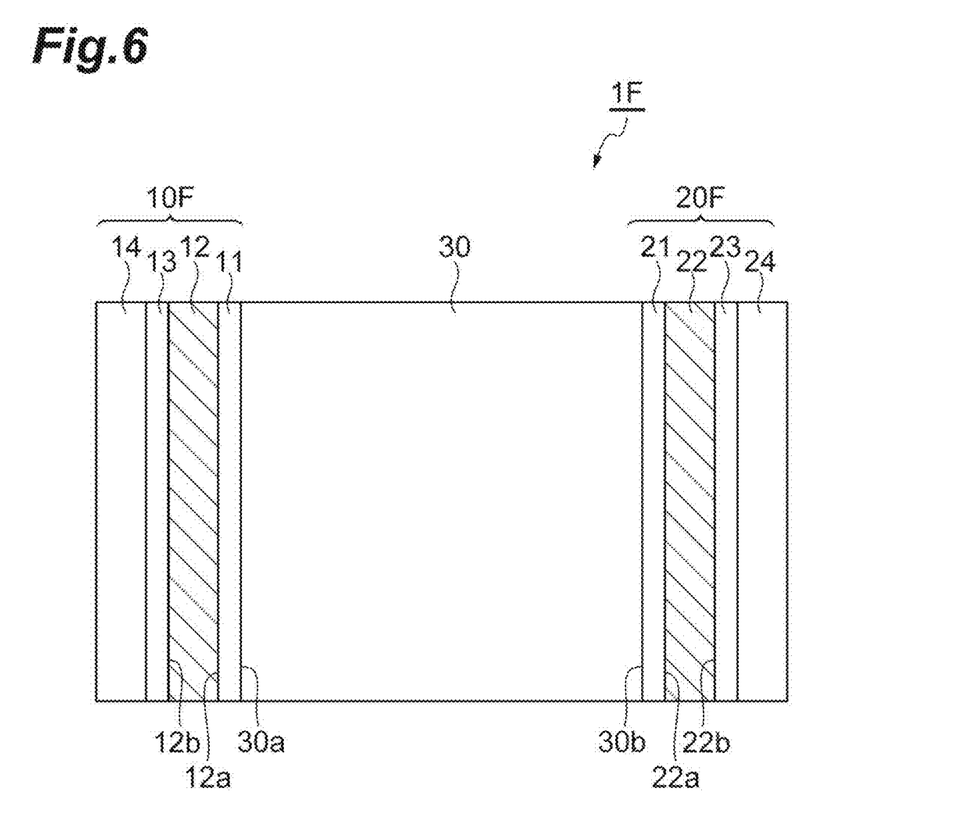
FIG. 6 is a view illustrating a cross-sectional structure of a radiation detector 1F according to a sixth embodiment.

FIG. 6 is a view illustrating a cross-sectional structure of a radiation detector 1F according to a sixth embodiment. The radiation detector 1F comprises: a first electrode 10F; a second electrode 20F; and a thallium bromide (TlBr) crystalline body 30 provided between the first electrode 10F and the second electrode 20F. A configuration of the sixth embodiment illustrated in FIG. 6 is the same as the configuration of the third embodiment illustrated in FIG. 3 except for an electrode structure. That is, although the first electrode 10F also includes an alloy layer 12 including a first layer surface 12a and a second layer surface 12b opposed to each other, a low-resistance metal layer 14 provided on the second layer surface 12b, and an intermediate layer 13 provided between the second layer surface 12b of the alloy layer 12 and the low-resistance metal layer 14, this is different from the first electrode 10C in FIG. 3 in that an intermediate layer 13 is formed between a first electrode installation surface 30a of the TlBr crystalline body 30 and the first layer surface 12a of the alloy layer 12 by vapor deposition, for example. Meanwhile, the first electrode 10F is formed in a gap of an island-shaped structure. Also, although the second electrode 20F also includes an alloy layer 22 including a first layer surface 22a and a second layer surface 22b opposed to each other, a low-resistance metal layer 24 provided on the second layer surface 22b, and an intermediate layer 23 provided between the second layer surface 22b of the alloy layer 22 and the low-resistance metal layer 24, this is different from the first electrode 10C in FIG. 3 in that an under layer 21 being a thin film having an island-shaped structure is formed between a second electrode installation surface 30b of the TlBr crystalline body 30 and the first layer surface 22a of the alloy layer 22 by vapor deposition (resistance heating method), for example. Meanwhile, the second electrode 20F is formed in a gap of an island-shaped structure. Also, in an example in FIG. 6, the first electrode 10F and the second electrode 20F have the same layer structure (the layer structures bilaterally symmetrical with respect to the TlBr crystalline body 30 in FIG. 6).

In the fourth to sixth embodiments, the under layer 11 is inserted in order to improve adhesion between the TlBr crystalline body 30 and the alloy layer 12. The under layer 21 is inserted to improve the adhesion between the TlBr crystalline body 30 and the alloy layer 22. Each of the under layers 11 and 21 has conductivity. A thickness of each of the under layers 11 and 21 is, for example, several nm to tens of nm. Any material may be used for making each of the under layers 11 and 21, but any metal selected from a group of chromium (Cr), nickel (Ni), and titanium (Tl) is preferably used.

A method of manufacturing the radiation detector 1F according to the sixth embodiment is next described as an example. Meanwhile, the following description relates to an example in which lead (Pb) is used as another metal and an alloy of Tl and Pb is applied to the alloy layers 12 and 22.

First, when the TlBr crystalline body 30 is obtained by cutting a wafer of a TlBr crystal into an appropriate size (for example, a rectangle having a side length of approximately 10 to 20 mm), surfaces (surfaces which become the first electrode installation surface 30a and the second electrode installation surface 30b) of the obtained TlBr crystalline body 30 are polished. Meanwhile, it is also possible that the wafer is cut after the wafer is polished in order to obtain the TlBr crystalline body 30. When Tl and Pb as raw materials are put in a tungsten boat with an appropriate weight ratio, the tungsten boat is heated in a vacuum chamber a pressure therein is reduced to $10^{-3}$ Pa or lower. As a result, an alloy of Tl and Pb is obtained.

The under layer 11 is formed thinly on the polished surface (first electrode installation surface 30a) of the TlBr crystal 30 by vapor deposition using any metal selected from a group of Cr, Ni, and Tl as an evaporation source. Thereafter, the alloy layer 12 is formed on the under layer 11 by vapor deposition using the metals alloyed in the boat as an evaporation source. By providing the under layer 11, the adhesion between the TlBr crystalline body 30 and the alloy layer 12 may be improved.

After the TlBr crystalline body 30 in which up to the alloy layer 12 is formed on the first electrode installation surface 30a is cooled, the intermediate layer 13 is formed thinly on the second layer surface 12b of the alloy layer 12 by vapor deposition by using any metal selected from a group of Cr, Ni, and Tl as an evaporation source. Thereafter, the low-resistance metal layer 14 is formed on the intermediate layer 13 by vapor deposition using gold (Au) as an evaporation source. By providing the intermediate layer 13, adhesion between the alloy layer 12 and the low-resistance metal layer 14 may be improved. In the above-described manner, the first electrode 10F is formed on one surface (the first electrode installation surface 30a) of the TlBr crystalline body 30.

After the TlBr crystalline body 30 in which the first electrode 10F is formed on the first electrode installation surface 30a is sufficiently cooled, the under layer 21, the alloy layer 22, the intermediate layer 23, and the low-resistance metal layer 24 are sequentially formed by vapor deposition on another polished surface (the second electrode installation surface 30b) of the TlBr crystalline body 30 opposed to the surface on which the first electrode 10F is formed as in a manufacturing procedure of the first electrode 10F, thereby forming the second electrode 20F. The radiation detector 1F is obtained through the above-described manufacturing step.

Meanwhile, it is possible to improve the adhesion and electrical stability of the alloy layer 12 by heating the TlBr crystalline body 30 on stages before, after, or during vapor deposition of the alloy layer 12. Also, as a method of manufacturing the alloy layers 12 and 22, for example, a method in which Pb is first adhered to the TlBr crystalline body 30 by vapor deposition and then Tl is adhered by vapor deposition, or a method in which Tl is first adhered to the TlBr crystalline body 30 by vapor deposition and then Pb is vapor-deposited is applicable, for example.

The present invention is not limited to the above embodiments, and various modifications are possible. For example, the first electrode may be an electrode including an alloy layer comprised of an alloy of metallic thallium and another metal different from the metallic thallium, and the second electrode may be an electrode (thallium electrode) comprised of only of metallic thallium. In this case, for example, the first electrode may be connected to a pad of a readout circuit board while being exposed, the second electrode may be directly connected to the pad of the readout circuit board, and the second electrode may be sealed with resin and the like. As the sealing resin, for example, epoxy resin may be used. In this case, by providing an under layer between the second electrode and the TlBr crystalline body, it is possible to improve adhesion between the TlBr crystalline body and the thallium electrode as in a case of the alloy layer. The first electrode may be an electrode including an alloy layer comprised of an alloy of metallic thallium and another metal different from the metallic thallium, and the second electrode may be an electrode comprised of gold.

Figure 7:
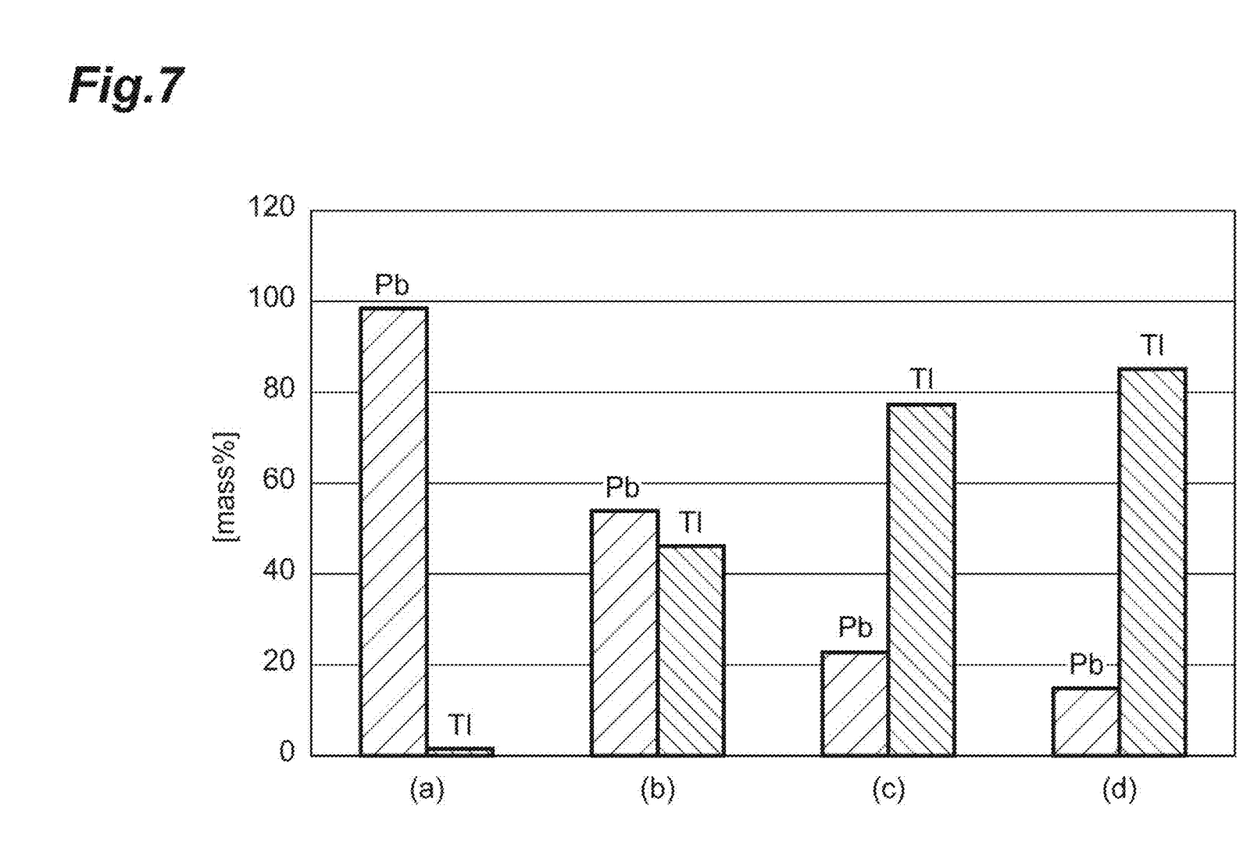
FIG. 7 is a graph indicating a content weight ratio of Pb and Tl after alloying for each of a plurality of alloy layer samples (a) to (d) having different weight ratios of Pb and Tl as metal raw materials before alloying.

FIG. 7 is a graph indicating a content weight ratio of Pb and Tl after alloying for each of a plurality of alloy layer samples (a) to (d) having different weight ratios of Pb and Tl as metal raw materials before alloying. The weight ratio of Pb and Tl (Pb:Al) before alloying is 80:20 in the sample (a), 60:40 in the sample (b), 40:60 in the sample (c), and 20:80 in the sample (d).

Figure 8:
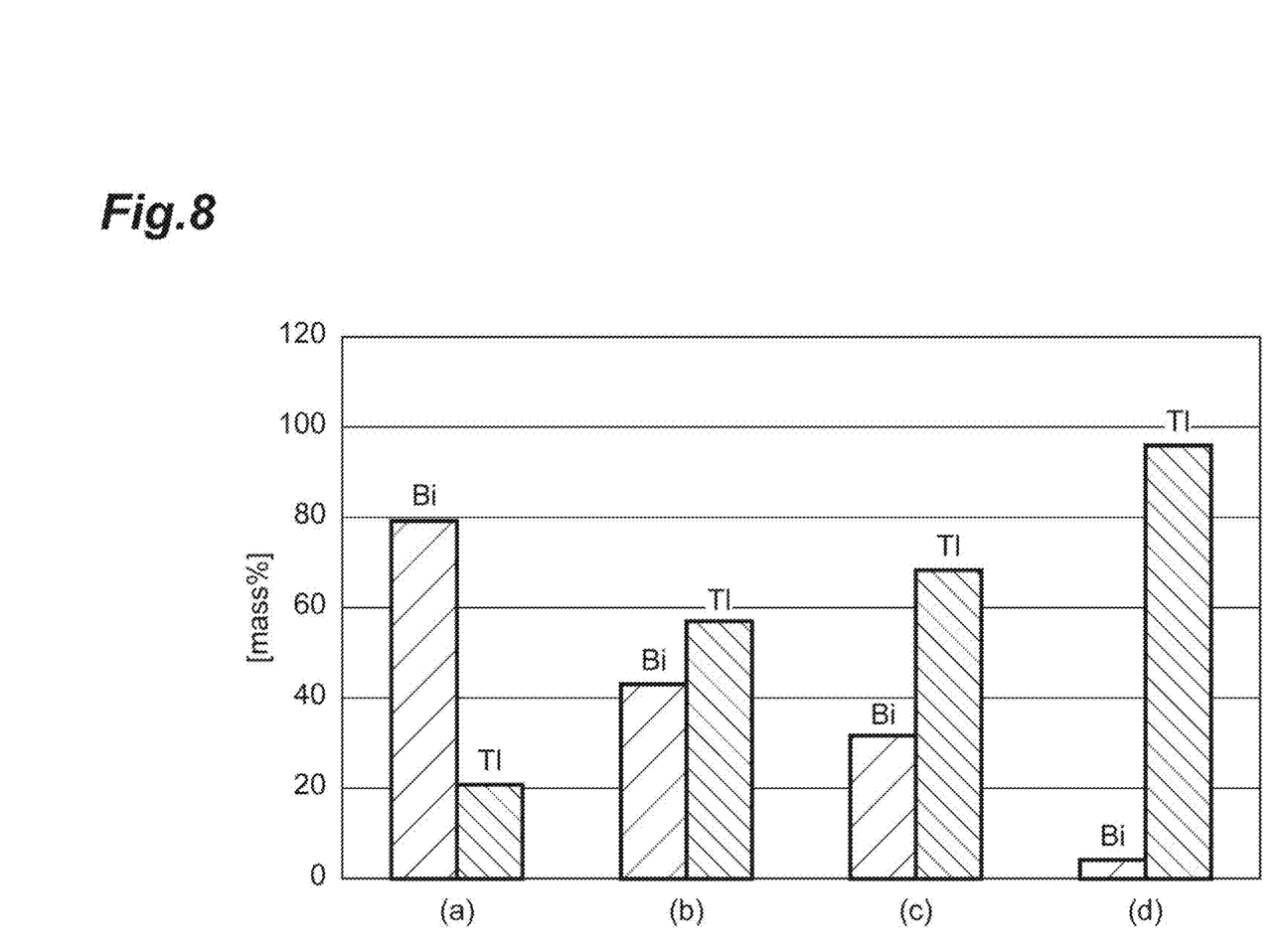
FIG. 8 is a graph indicating a content weight ratio of Bi and Tl after alloying for each of a plurality of alloy layer samples (a) to (d) having different weight ratios of Bi and Tl as metal raw materials before alloying.

FIG. 8 is a graph indicating a content weight ratio of Bi and Tl after alloying for each of a plurality of alloy layer samples (a) to (d) having different weight ratios of Bi and Tl as metal raw materials before alloying. The weight ratio of Bi and Tl (Bi:Tl) before alloying is 80:20 in the sample (a), 60:40 in the sample (b), 40:60 in the sample (c), and 20:80 in the sample (d).

The content weight ratio of each metal in the alloy layer samples illustrated in FIGS. 7 and 8 was measured using the X-Ray fluorescence spectrometer (ZSX Primus) manufactured by Rigaku Corporation. As illustrated in FIGS. 7 and 8, the content weight ratio of each metal in the alloy layer does not always coincide with the weight ratio of each metal as the raw material before alloying. Therefore, in order to set the content weight ratio of each metal in the alloy layer to a desired value, it is preferable to mix the raw materials before alloying with the weight ratio of each metal according to the desired value and alloy them.

Figure 9A:
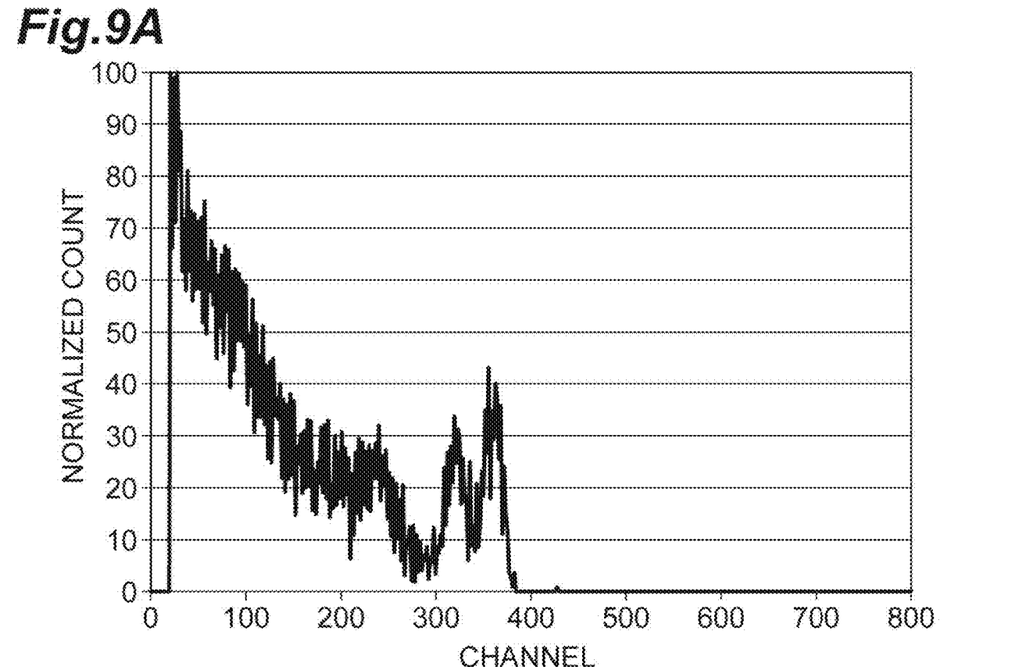
FIGS. 9A and 9B illustrate Cs-137 gamma ray spectrums obtained using the radiation detector according to the present embodiment.
Figure 9B:
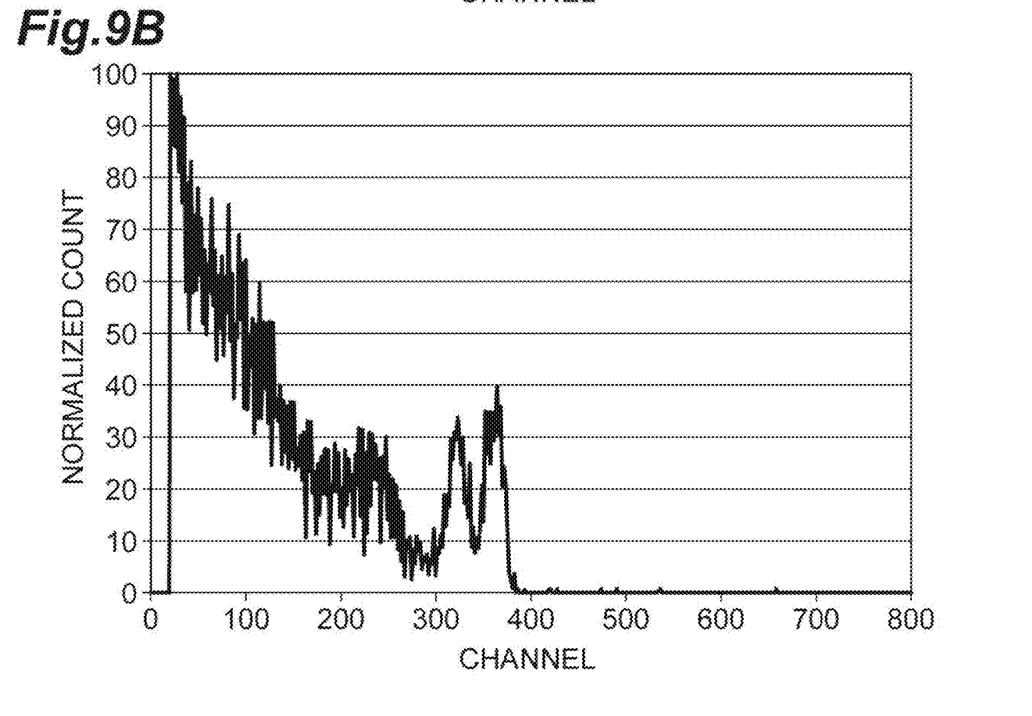

Each of FIGS. 9A and 9B illustrates a Cs-137 gamma ray spectrum obtained using the radiation detector according to the present embodiment. Meanwhile, FIG. 9A illustrates the spectrum five minutes after the operation starts, and FIG. 9B illustrates the spectrum six hours after the operation starts. Meanwhile, in each of FIGS. 9A and 9B, the abscissa represents a channel, and the ordinate represents a normalized count normalized by setting a maximum count to 100. The radiation detector to be measured has the configuration of the first embodiment, and the alloy layer contains Tl and Pb with the weight ratio of 60:40 and has a thickness of 100 nm. The device used for spectrum measurement is a pre-amplifier (CLEAR-PULSE 580 HP), a shaping amplifier (ORTEC 673), and a multi-channel analyzer (Laboratory equipment 2100C/MCA). As illustrated in FIGS. 9A and 9B, it was confirmed that the radiation detector according to the present embodiment may continuously operate for six hours even if the electrode is not sealed with resin. Meanwhile, in a radiation detector according to a comparative example including an electrode comprised of only of Tl, the electrode corroded (blackened) before elapse of one hour from the operation start, and a characteristic was deteriorated. As described above, the radiation detector according to the present embodiment may effectively suppress the corrosion of the electrode in the air.

A result of examining the adhesion of the electrode to the TlBr crystalline body in the radiation detector is next described. The electrode to be examined has the configuration of the second embodiment and has the layered structure of the alloy layer and the low-resistance metal layer. The alloy layer contains Tl and Pb with a weight ratio of 60:40 and has a thickness of 100 nm. The low-resistance metal layer provided on the alloy layer is comprised of gold and has a thickness of 100 nm. On the other hand, the electrode according to the comparative example has a layered structure of a metal layer different from that in the present embodiment and a low-resistance metal layer provided on the metal layer. The metal layer is comprised of only of Tl and this has a thickness of 100 nm. The low-resistance metal layer provided on the metal layer is comprised of gold and has a thickness of 100 nm. The radiation detector was installed in an atmosphere at temperature of 150° C., 175° C., and 200° C. for one minute, and presence of peeling of the electrode from the TlBr crystalline body was examined. The electrode peeled off at temperature of 150° C. in the comparative example; however, the electrode did not peel off even at temperature of 200° C. in the present embodiment. As described above, in the radiation detector according to the present embodiment, the peeling of the electrode from the TlBr crystalline body at high temperature is suppressed, and reliability may be secured.

REFERENCE SIGNS LIST 1A to 1F . . . Radiation detector; 10A to 10F . . . First electrode; 11, 21 . . . Under layer; 12, 22 . . . Alloy layer; 13, 23 . . . Intermediate layer; 14, 24 . . . Low-resistance metal layer; 20A to 20F . . . Second electrode; and 30 . . . Thallium bromide crystalline body.

The invention claimed is:

1. A radiation detector comprising:
a thallium bromide crystalline body having a first electrode installation surface and a second electrode installation surface opposed to the first electrode installation surface;
a first electrode provided on the first electrode installation surface of the thallium bromide crystalline body; and
a second electrode provided on the second electrode installation surface of the thallium bromide crystalline body,
wherein at least the first electrode out of the first and second electrodes includes an alloy layer having a first layer surface facing the first electrode installation surface and a second layer surface located on a side opposite to the first electrode installation surface across the first layer surface, the alloy layer comprised of an alloy of metallic thallium and one or more other metals different from the metallic thallium, the thallium bromide crystalline body being in contact with the first layer surface of the alloy layer without being in contact with the second layer surface of the alloy layer.

2. The radiation detector according to claim 1, wherein each of the other metals includes any metal selected from a group of lead, silver, bismuth, and indium as a metallic element forming the alloy together with the metallic thallium.

3. The radiation detector according to claim 2, wherein the first electrode includes a low-resistance metal layer comprised of metal having a resistance value lower than the resistance value of the alloy layer provided on the second layer surface of the alloy layer.

4. The radiation detector according to claim 3, wherein the low-resistance metal layer is comprised of gold.

5. The radiation detector according to claim 4, wherein the first electrode includes a conductive intermediate layer provided between the second layer surface of the alloy layer and the low-resistance metal layer, the conductive intermediate layer improving adhesion between the alloy layer and the low-resistance metal layer.

6. The radiation detector according to claim 5, wherein the intermediate layer is comprised of any metal selected from a group of chromium, nickel, and titanium.

7. The radiation detector according to claim 3, wherein the first electrode includes a conductive intermediate layer provided between the second layer surface of the alloy layer and the low-resistance metal layer, the conductive intermediate layer improving adhesion between the alloy layer and the low-resistance metal layer.

8. The radiation detector according to claim 7, wherein the intermediate layer is comprised of any metal selected from a group of chromium, nickel, and titanium.

9. The radiation detector according to claim 1, wherein the first electrode includes a low-resistance metal layer comprised of metal having a resistance value lower than the resistance value of the alloy layer provided on the second layer surface of the alloy layer.

10. The radiation detector according to claim 9, wherein the low-resistance metal layer is comprised of gold.

11. The radiation detector according to claim 10, wherein the first electrode includes a conductive intermediate layer provided between the second layer surface of the alloy layer and the low-resistance metal layer, the conductive intermediate layer improving adhesion between the alloy layer and the low-resistance metal layer.

12. The radiation detector according to claim 11, wherein the intermediate layer is comprised of any metal selected from a group of chromium, nickel, and titanium.

13. The radiation detector according to claim 9, wherein the first electrode includes a conductive intermediate layer provided between the second layer surface of the alloy layer and the low-resistance metal layer, the conductive intermediate layer improving adhesion between the alloy layer and the low-resistance metal layer.

14. The radiation detector according to claim 13, wherein the intermediate layer is comprised of any metal selected from a group of chromium, nickel, and titanium.

15. The radiation detector according to claim 1, wherein the first electrode includes a conductive under layer provided between the first electrode installation surface of the thallium bromide crystalline body and the first layer surface of the alloy layer, the conductive under layer improving adhesion between the thallium bromide crystalline body and the alloy layer.

16. The radiation detector according to claim 15, wherein the under layer is comprised of any metal selected from the group of chromium, nickel, and titanium.

* * * * *

UNITED STATES PATENT AND TRADEMARK OFFICE
CERTIFICATE OF CORRECTION

PATENT NO. : 10,782,427 B2
APPLICATION NO. : 15/740524
DATED : September 22, 2020
INVENTOR(S) : Masanori Kinpara, Toshiyuki Onodera and Keitaro Hitomi It is certified that error appears in the above-identified patent and that said Letters Patent is hereby corrected as shown below:

On the Title Page

Item (73) "Assignee" change "HAMAMATSU PHOTONIX K.K." to --HAMAMATSU PHOTONICS K.K.--

Signed and Sealed this
Twenty-second Day of December, 2020

Andrei Iancu
*Director of the United States Patent and Trademark Office*